United States Patent
Lee et al.

(10) Patent No.: US 9,607,667 B1
(45) Date of Patent: Mar. 28, 2017

(54) MEMORY DEVICE AND ELECTRONIC APPARATUS INCLUDING THE SAME

(71) Applicant: SK hynix Inc., Icheon-si, Gyeonggi-do (KR)

(72) Inventors: Sang Eun Lee, Chuncheon-si (KR); Eun Ko, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/053,113

(22) Filed: Feb. 25, 2016

(30) Foreign Application Priority Data

Sep. 14, 2015 (KR) .................. 10-2015-0129830

(51) Int. Cl.
   *G11C 7/10* (2006.01)
(52) U.S. Cl.
   CPC .................................. *G11C 7/1048* (2013.01)
(58) Field of Classification Search
   CPC ............................... G11C 7/1048; G11C 7/10
   USPC .................... 365/189.18, 189.19, 230.03
   See application file for complete search history.

(56) References Cited

U.S. PATENT DOCUMENTS

| | | | |
|---|---|---|---|
| 2001/0048626 A1* | 12/2001 | Choi ................... | G11C 7/1096 365/201 |
| 2006/0193189 A1 | 8/2006 | Nam | |
| 2013/0128675 A1 | 5/2013 | Kim et al. | |
| 2013/0322162 A1* | 12/2013 | Lee ................... | G11C 11/1653 365/158 |
| 2014/0269073 A1* | 9/2014 | Itagaki ................. | G11C 16/26 365/185.11 |

FOREIGN PATENT DOCUMENTS

| | | |
|---|---|---|
| KR | 100609623 B1 | 7/2006 |
| KR | 1020130056004 A | 5/2013 |

* cited by examiner

*Primary Examiner* — Han Yang
(74) *Attorney, Agent, or Firm* — William Park & Associates Ltd.

(57) ABSTRACT

A memory device includes a plurality of channels that respectively include memory cell arrays and local input/output lines electrically coupled to the memory cell arrays and are independently operable, shared global input/output lines electrically coupled to the local input/output lines included in the plurality of channels and having a connection relation controlled through one or more path switch circuits arranged among the plurality of channels, and the path switch circuits that control the connection relation of the shared global input/output lines according to a path control signal.

24 Claims, 5 Drawing Sheets

MEMORY DEVICE AND ELECTRONIC APPARATUS INCLUDING THE SAME

CROSS-REFERENCES TO RELATED APPLICATION

The present application claims priority under 35 U.S.C. §119(a) to Korean application number 10-2015-0129830, filed on Sep. 14, 2015, in the Korean Intellectual Property Office, which is incorporated herein by reference in its entirety.

BACKGROUND

1. Technical Field

Various embodiments generally relate to a memory device and an electronic apparatus including the same, and more particularly, to a memory device having a plurality of channels and an electronic apparatus including the same.

2. Related Art

Researches for improving the degree of integration of a memory in order to achieve a small electronic apparatus have been continuously conducted. In order to reduce power consumption, various interface schemes have been researched.

Among such researches, a scheme for allowing one memory device to have a plurality of channel interfaces has been proposed. A plurality of channels may operate independently of one another.

SUMMARY

In an embodiment, a memory device includes a plurality of channels that include memory cell arrays and local input/output lines electrically coupled to the memory cell arrays and are independently operable. The memory device also includes shared global input/output lines electrically coupled to the local input/output lines included in the plurality of channels and having a connection relation controlled through one or more path switch circuits arranged among the plurality of channels. Further, the path switch circuits control the connection relation of the shared global input/output lines according to a path control signal.

In an embodiment, an electronic apparatus includes a command generator that generates an internal operation command for internally transferring data among a plurality of channels in response to a request from a host. The electronic apparatus also includes a path control circuit that generates a path control signal for controlling paths among the plurality of channels according to the internal operation command. The electronic apparatus also includes a memory device that includes a plurality of channels which are independently operable, and internally transfer data through shared global input/output lines electrically coupled to one another according to the path control signal.

In an embodiment, a memory device includes a plurality of channels that are independently operable and that include local input/output lines that are electrically coupled to memory cell arrays. The memory device also includes shared global input/output lines electrically coupled to each other among the plurality of channels while interposing path switch circuits. The memory device also includes a path control circuit configured to provide path control signals to the path switch circuits electrically coupled to the shared global input/output lines.

Wherein the comparison circuit includes an exclusive OR operator.

Wherein the comparison circuit performs an exclusive OR operation on data read from the plurality of channels.

A physical layer (PHY) that receives output of the comparison circuit and performs an error correction operation.

Wherein when data is simultaneously written, the external writing command and the internal command are provided.

DETAILED DESCRIPTION

Hereinafter, a memory device and an electronic apparatus including the same will be described below with reference to the accompanying figures through various examples of embodiments. Various embodiments are directed to a memory device and an electronic apparatus including the same, by which it is possible to share or transfer data among a plurality of channels independently operating by sharing input/output paths of the plurality of channels, so that it is possible to reduce the consumption of an operation time, which may occur while the channels are performing an input/output operation with respect to an exterior. Various embodiments are directed to a memory device and an electronic apparatus including the same, by which it is possible to share or transfer data among a plurality of channels independently operating by sharing input/output paths of the plurality of channels, so that it is possible to reduce the consumption of an operation time, which may occur while the channels are performing an input/output operation with respect to an exterior. Various embodiments are directed to a memory device and an electronic apparatus including the same, by which it is possible to improve the degree of data reliability by comparing data among a plurality of channels with one another and outputting a comparison result. According to various embodiments disclosed in the invention, the memory device and the electronic apparatus including the same enable an operation capable of transferring data among a plurality of channels, thereby minimizing a data transfer speed. According to various embodiments disclosed in the invention, in the memory device and the electronic apparatus including the same, a plurality of channels share input/output paths and control the shared paths, so that various schemes of data input/output is possible. Consequently, the memory device and the electronic apparatus including the same can operate by utilizing various data input/output operations.

Figure 2:
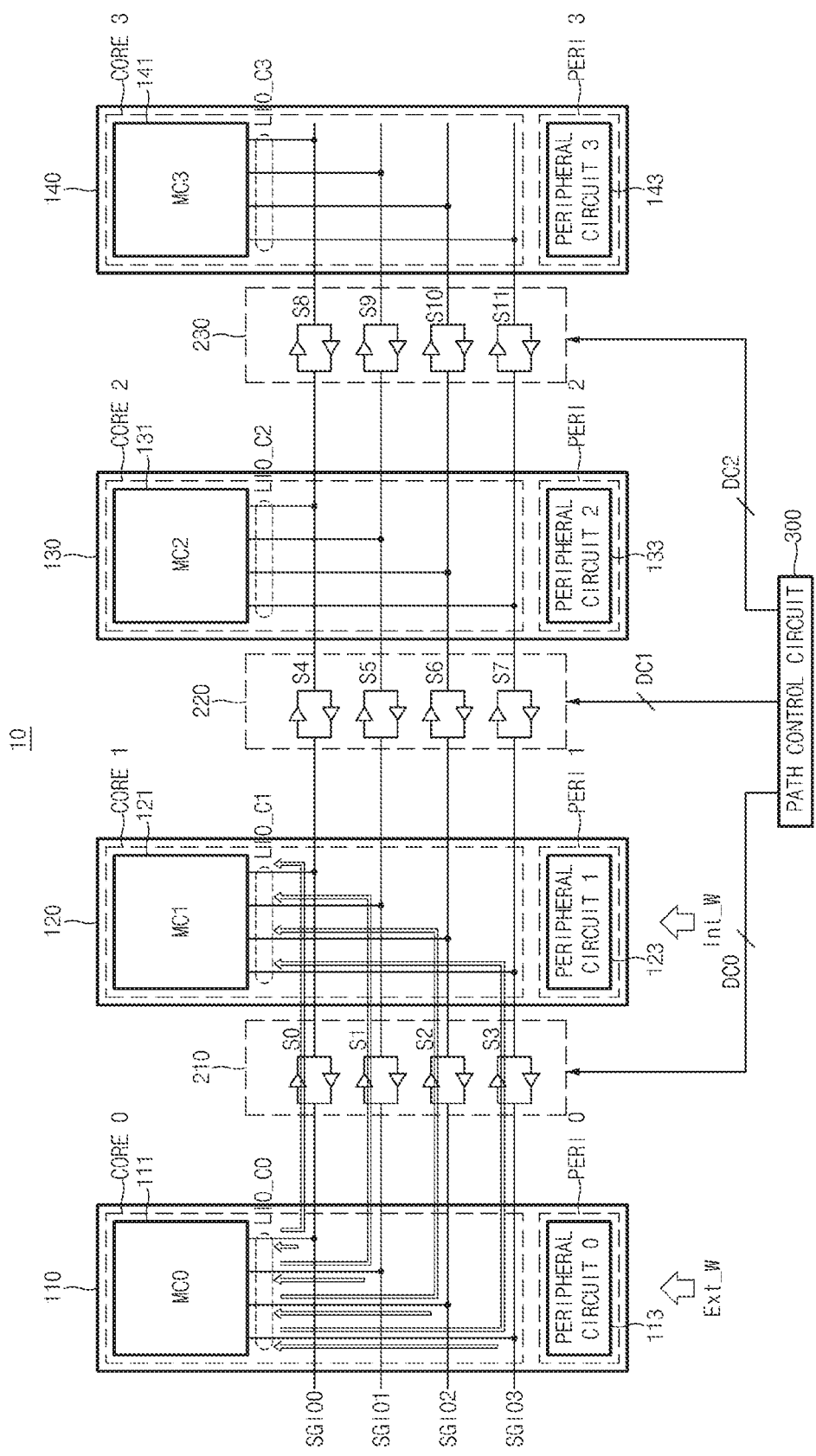
FIG. 2 and FIG. 3 are diagrams for explaining an operation of a memory device according to an embodiment of the invention.

Referring to FIG. 2, a diagram illustrating a memory device according to an embodiment of the invention is illustrated.

Figure 1:
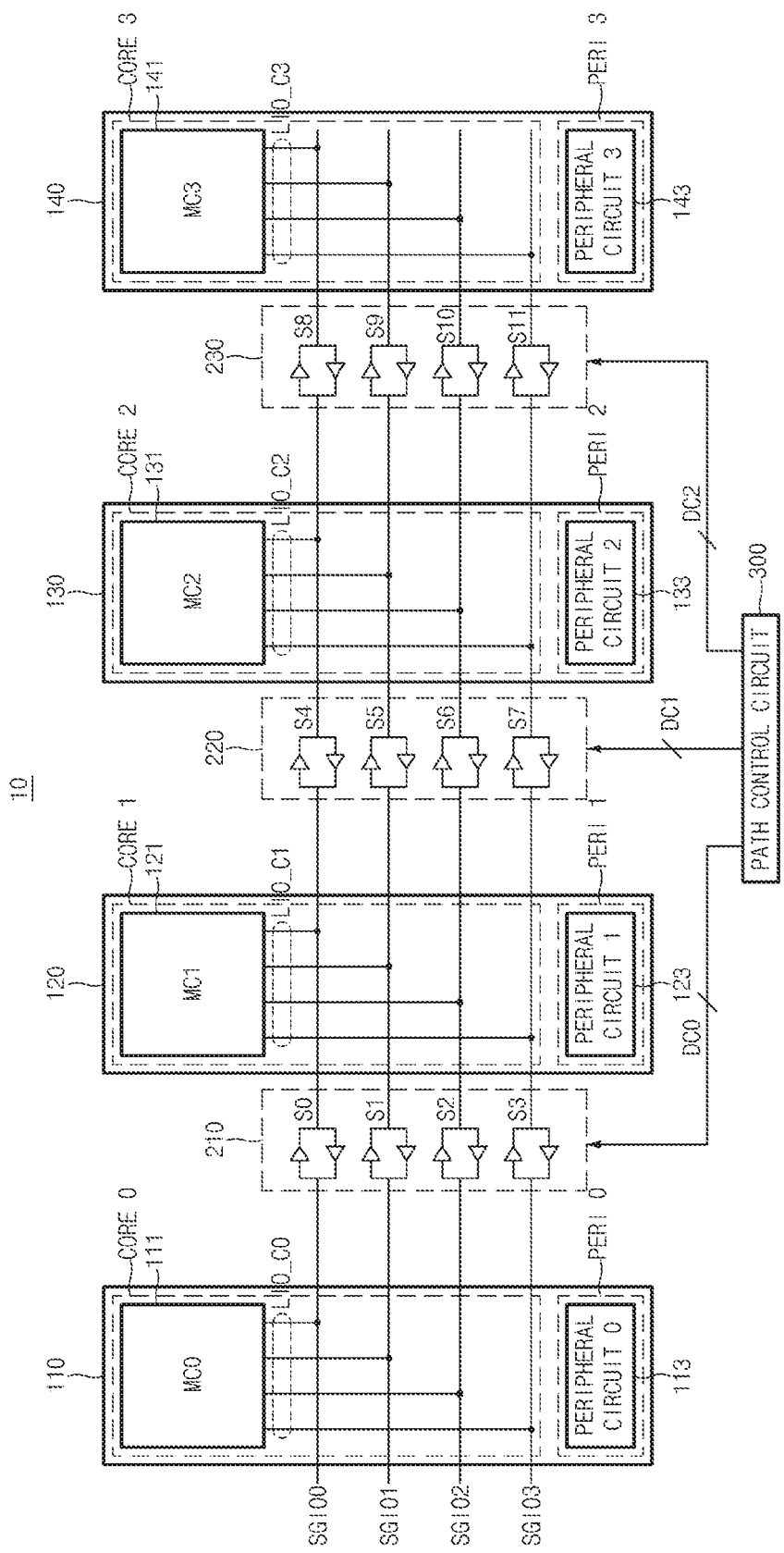
FIG. 1 is a diagram illustrating a memory device according to an embodiment of the invention.

In FIG. 1, a memory device 10 may include a plurality of channels 110, 120, 130, and 140 capable of independently operating, path switch units 210, 220, and 230 that electrically couple paths shared among the channels to one another, and a path control circuit 300. The internal components of the memory device 10 may be configured as circuits.

The plurality of channels 110, 120, 130, and 140 included in the memory device 10 respectively include memory cell arrays 111, 121, 131, and 141, local input/output lines LIO_C0 to LIO_C3 electrically coupled to the memory cell arrays 111, 121, 131, and 141, and shared global input/output lines SGIO0 to SGIO3 electrically coupled to one another among the channels while interposing the path switch units 210, 220, and 230 among them.

The memory cell arrays 111, 121, 131, and 141 respectively include a plurality of word lines and a plurality of memory cells electrically coupled to a plurality of bit lines crossing the plurality of word lines. The plurality of memory cells may be grouped into a plurality of memory banks and/or a plurality of memory blocks.

The memory cell arrays 111, 121, 131, and 141 may include volatile memory cells such as a SRAM (Static RAM), a DRAM (Dynamic RAM), and a SDRAM (Synchronous DRAM), and nonvolatile memory cells such as a ROM (Read Only Memory), a PROM (Programmable ROM), an EEPROM (Electrically Erase and Programmable ROM), an EPROM (Electrically Programmable ROM), a flash memory, a PRAM (Phase change ROM), a MRAM (Magnetic RAM), a RRAM (Resistive RAM), and a FRAM (Ferroelectric RAM).

According to embodiments, the plurality of channels 110, 120, 130, and 140 may further include peripheral circuits 113, 123, 133, and 143, respectively. In the peripheral circuits 113, 123, 133, and 143, a row decoder, a column decoder, an input/output sense amplifier and the like for channel-based input/output of the memory cell arrays 111, 121, 131, and 141 may be arranged.

The plurality of channels 110, 120, 130, and 140 may be divided into core areas core0 to core3 and peripheral areas peripheral area0 to peripheral area3, and although not illustrated in the figure, the core areas core0 to core3 may include a channel control circuit for independently controlling operations of the channels. The channel control circuit can control the channels 110, 120, 130, and 140 to perform operations different from one another at the same time point on the basis of commands provided to each channel.

For example, a writing operation may be performed for the first channel 110 included in the memory device 10 and simultaneously a read operation may be performed for the second channel 120. In addition, for the plurality of channels 110, 120, 130, and 140, different types of CAS (Column Address Strobe) latency, burst lengths, and burst types may be designated. Furthermore, for the plurality of channels 110, 120, 130, and 140, clock signals with frequencies from one another may be used. Further, different types of interfaces such as SDR (Single Data Rate), DDR (Double Data Rate), DDR2, and LPDDR (Low Power DDR) may be applied.

The local input/output lines LIO_C0 to LIO_C3 electrically coupled to the memory cell arrays 111, 121, 131, and 141 of the plurality of channels 110, 120, 130, and 140 may perform an input/output operation with respect to an exterior through global input/output lines.

In the memory device 10 according to an embodiment of the invention, the local input/output lines LIO_C0 to LIO_C3 of the channels are electrically coupled to the shared global input/output lines SGIO0 to SGIO3 electrically coupled through the path switch units 210, 220, and 230.

The path switch units 210, 220, 230, and 240 may include bidirectional switches S0 to S3, S4 to S7, and S8 to S11, which are arranged on the shared global input/output lines SGIO0 to SGIO3 electrically coupled to the local input/output lines LIO_C0 to LIO_C3 of the plurality of channels 110, 120, 130, and 140, respectively.

The path switch units 210, 220, 230, and 240 control a connection relation of the shared global input/output lines SGIO0 to SGIO3 provided to the channels 110, 120, 130, and 140, thereby allowing the shared global input/output lines SGIO0 to SGIO3 to be separated from or be electrically coupled to one another among the plurality of channels 110, 120, 130, and 140.

The path control circuit 300 can provide path control signals DC0 to DC2 to the path switch units 210, 220, and 230 electrically coupled to the shared global input/output lines SGIO0 to SGIO3, thereby controlling paths of the shared global input/output lines SGIO0 to SGIO3.

For example, when the channels 110, 120, 130, and 140 independently operate, the path control circuit 300 generates the path control signals DC0 to DC2 such that all the path switch units 210, 220, and 230 are turned off, thereby preventing the shared global input/output lines SGIO0 to SGIO3 of the channels 110, 120, 130, and 140 from being electrically coupled to one another.

The path control circuit 300 can generate the path control signals DC0 to DC2 on the basis of a command signal received from an element such as a host. Each path signal may include a plurality of bits.

For example, the first path switch unit 210 for electrically coupling the first channel 110 and the second channel 120 to each other may also include four path switches respectively electrically coupled to the first shared global input/output line SGIO0 to the fourth shared global input/output line SGIO3. Furthermore, each path switch may also include bidirectional switch elements.

The first path control signal DC0 provided to the first path switch unit 210 may be a signal including at least four bits; or may also be activated at different timings on the basis of operation clocks of the shared global input/output lines SGIO0 to SGIO3.

As described above, the memory device 10 according to an embodiment of the invention has a configuration in which the plurality of channels 110, 120, 130, and 140 independently operating are electrically coupled to one another through the shared global input/output lines SGIO0 to SGIO3 having connection states controlled through the path control signals DC0 to DC2. Accordingly, the plurality of channels 110, 120, 130, and 140 can independently operate and can also exchange data among them.

Figure 3:
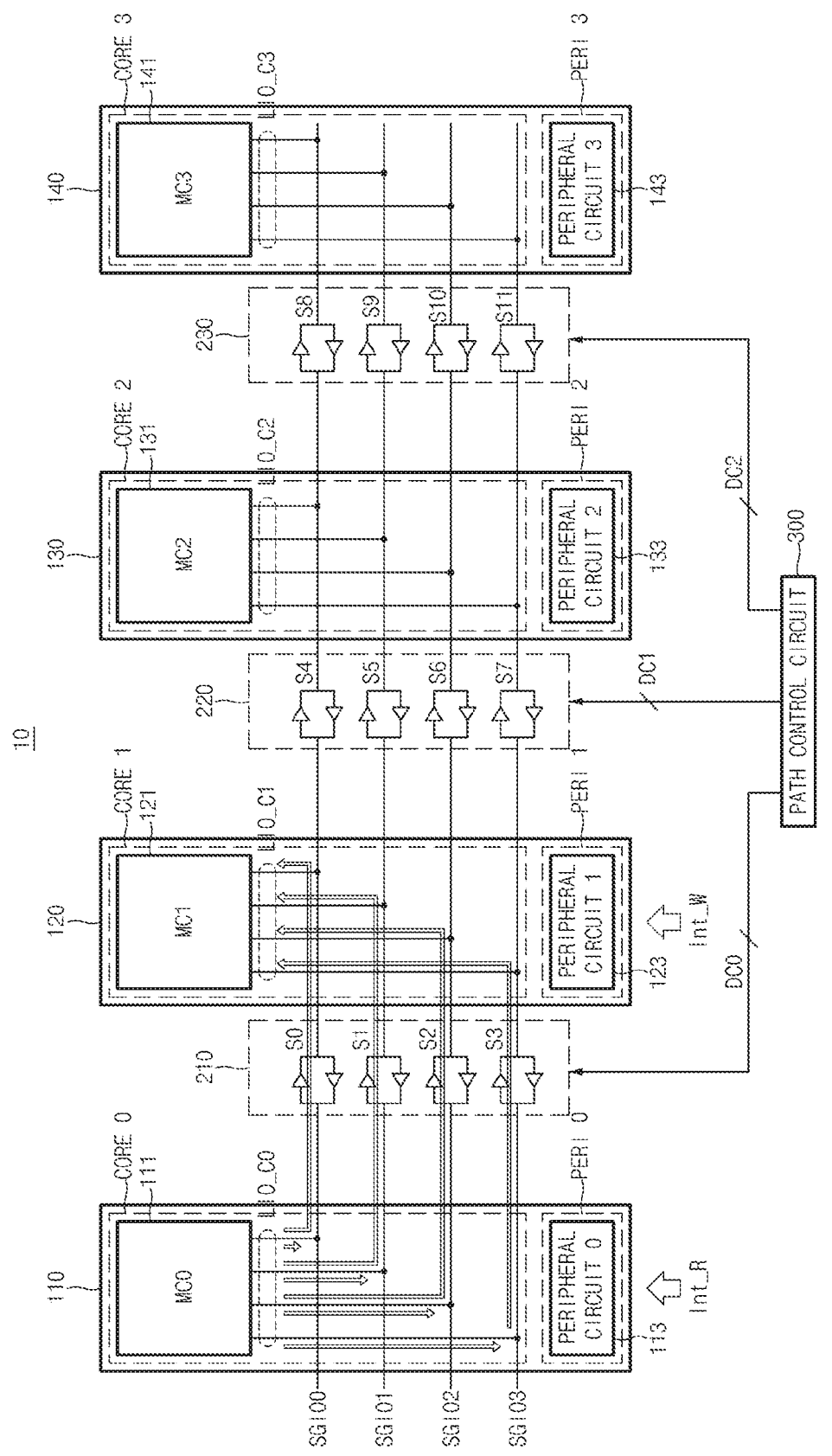
Figure 4:
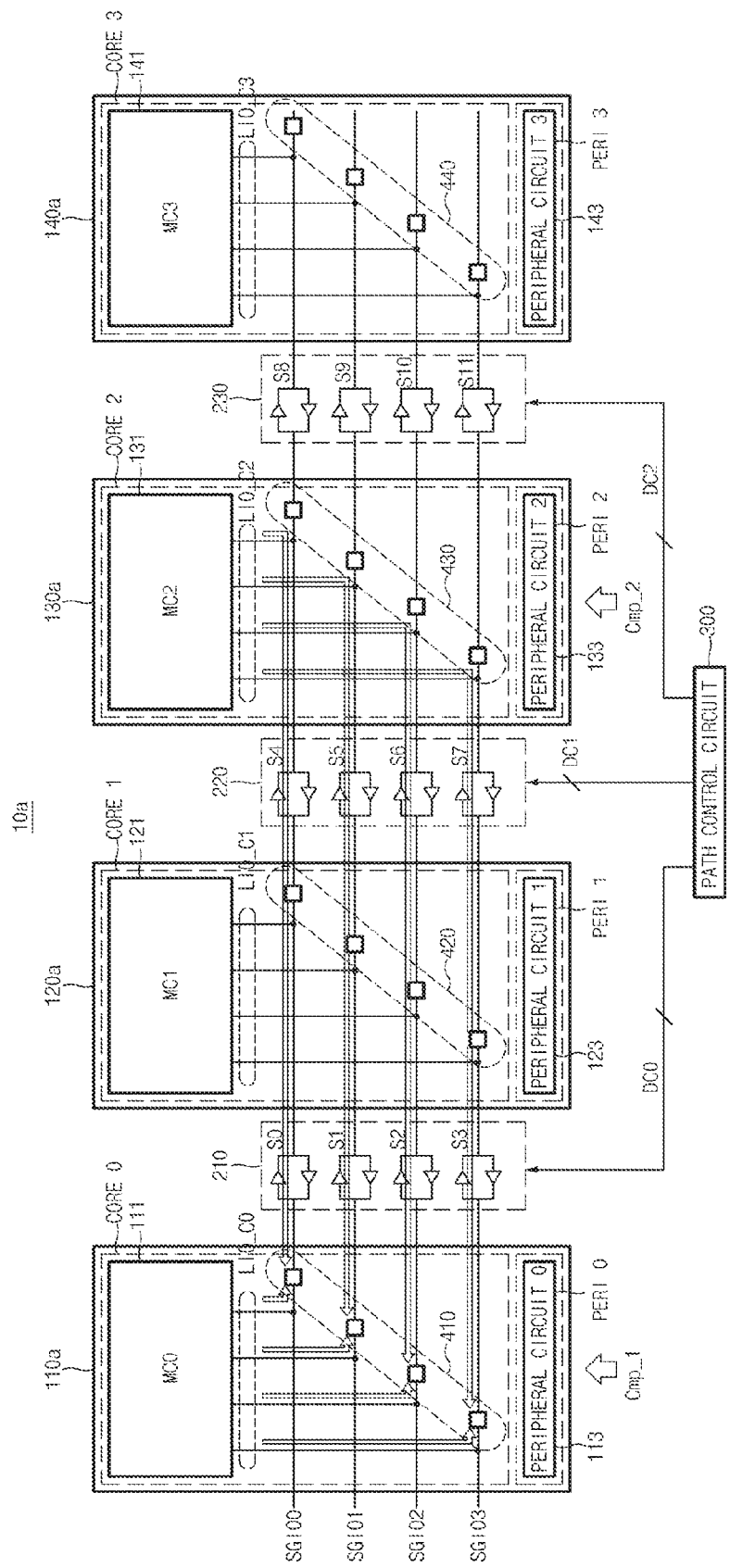
FIG. 4 is a diagram for explaining a configuration and an operation method of a memory device according to an embodiment of the invention.

An internal operation for exchanging data among the plurality of channels 110, 120, 130, and 140 will be described in detail with reference to FIG. 2 to FIG. 4. The same reference numerals in FIG. 2 to FIG. 4 are used to designate the same elements, and a detailed description thereof will be omitted.

Referring to FIG. 2, a diagram for explaining an operation of a memory device according to an embodiment of the invention is described.

A configuration of a memory device 10 of FIG. 2 is substantially the same as that of the memory device 10 described with reference to FIG. 1. In FIG. 2, the first channel 110 receives an external writing command Ext_W and the second channel 120 receives an internal command Int_W. The external writing command Ext_W and the internal command Int_W may be provided from an external apparatus such as a host. The two commands are associated commands, wherein the external writing command Ext_W may include information representing that data provided to the first channel 110 from an exterior is also internally written in the second channel 120. Further, the internal command Int_W may include information representing that data written in the first channel 110 from an exterior is also written in the second channel 120.

An operation for writing data provided from an exterior in the first channel 110 may be performed in response to the external writing command Ext_W. According to embodiments, when data is provided to the first to fourth global input/output lines SGIO0 to SGIO3 of the first channel 110, data may be simultaneously written in the first channel 110 and the second channel 120.

When the data is simultaneously written, the external writing command Ext_W and the internal command Int_W are provided and simultaneously the path control circuit 300 generates the first path control signal DC0 and turns on the first path switch unit 210.

When the data is simultaneously written in two or more channels, a writing operation can be performed without a limitation of tRC (Row cycle time) required for each channel in a general writing operation. Accordingly, it is possible to perform an operation more freely without a limitation of a timing among channels.

In an embodiment, while data provided from an exterior is being preferentially written in the first channel 110, the second channel 120 may also wait until the operation for the first channel 110 is completed.

When data writing has been completed for the first channel 110, the first path switch unit 210 is electrically coupled in response to the first path control signal DC0 from the path control circuit 300, so that a path is generated between the first channel 110 and the second channel 120. According to embodiments, the path control circuit 300 may receive a flag signal and the like indicating the completion of an external writing operation from the first channel 110 to electrically couple the first path switch unit 210; or may control the first path switch unit 210 to maintain a connected state while an external writing operation is being performed for the first channel 110.

When the shared global input/output lines SGIO0 to SGIO3 between the first channel 110 and the second channel 120 have not been electrically coupled through the first path switch unit 210, an operation, in which data written in the first channel 110 is read to an exterior of the memory device 10 and then data is inputted to and written in the second channel 120 from an exterior is performed.

When such an operation is performed, signal integrity characteristics is degraded due to current consumption in a process of performing an input/output operation through a DQ driver and signal delay occurs so that operational efficiency may be reduced.

In the memory device 10 according to an embodiment of the invention, a plurality of channels can internally exchange data through the shared global input/output lines SGIO0 to SGIO3 so that data transfer among the channels can be performed at a high speed. Such an operation can be appropriately utilized in a disk defragmentation operation or an internal error correction operation of the memory device 10.

According to embodiments, the third channel 130 and the fourth channel 140 may independently operate. The path control circuit 300 generates the second path control signal DC1 and the third path control signal DC2 and turns off the second path switch unit 220 and the third path switch unit 230. Accordingly, since the third channel 130 and the fourth channel 140 do not share the shared global input/output lines SGIO0 to SGIO3, they can independently operate.

Referring to FIG. 3, a diagram for explaining an operation of the memory device according to an embodiment of the invention is described.

In FIG. 3, the first channel 110 of the memory device 10 receives an internal read command Int_R and the second channel 120 receives an internal command Int_W. As described with reference to FIG. 2, in the memory device 10 according to an embodiment of the invention, when data is internally transferred among a plurality of channels, commands may include information regarding operations to be subsequently performed in other channels.

Accordingly, the internal read command Int_R received in the first channel 110 may include information regarding whether data read from the first channel 110 is provided to other channels. Furthermore, the internal command Int_W received in the second channel 120 may include information representing that data is received from the first channel 110.

The first channel 110 reads data included in a first memory cell array 111 in response to the internal read command Int_R. The first channel 110 also provides the data to the shared global input/output lines SGIO0 to SGIO3 through the first local input/output line LIO_C0. The data read from the first channel 110 is provided through the shared global input/output lines SGIO0 to SGIO3 electrically coupled through the first path switch unit 210 and is written in a second memory cell array 121 of the second channel 120.

In FIG. 2, a writing operation may be simultaneously performed for a plurality of channels. However, in the operation to be described in FIG. 3, since the data read from the first channel 110 is written in the second channel 120, the second channel 120 may sequentially write the data in the second memory cell array 121 in response to the reading of the data from the first channel 110.

According to embodiments, the amount of data provided to the second channel 120 from the first channel 110 may be decided according to the capacity of the shared global input/output lines SGIO0 to SGIO3. Further, the shared global input/output lines SGIO0 to SGIO3 may also include a buffer for temporarily storing data which is provided to other channels.

Referring to FIG. 3, illustrates a method in which data is transferred between two channels of the first channel 110 and the second channel 120, and the method has been described. However, the data read from the first channel 110 may also be written in the third channel 130 as well as the second channel 120. In this case, the path control circuit 300 may also turn on the second path switch unit 220 through the second path control signal DC1; and write the data read from the first channel 110 in a third memory cell array 131 included in the third channel 130.

Furthermore, according to embodiments, the fourth channel 140 may independently operate. The path control circuit 300 may generate the third path control signal DC2 to turn off the third path switch unit 230, and allow the fourth channel 140 to operate independently of the other channels 110, 120, and 130.

Referring to FIG. 4, a diagram for explaining a configuration and an operation method of a memory device according to an embodiment of the invention is described.

In FIG. 4, a memory device 10a according to an embodiment of the invention further includes comparison units 410, 420, 430, and 440 respectively electrically coupled to the shared global input/output lines SGIO0 to SGIO3 of channels 110a, 120a, 130a, and 140a differently from the memory device 10 described with reference to FIG. 1 to FIG. 3.

The comparison units 410, 420, 430, and 440 perform a function of comparing data read through two channels with each other and correcting an error. According to embodiments, the comparison units 410, 420, 430, and 440 may include a logical operation circuit that performs an XOR logical operation.

With reference to FIG. 4, an operation of the memory device 10a according to an embodiment of the invention will be described.

In FIG. 4, the first channel 110a receives a first comparison command Cmp_1 and the third channel 130a receives a second comparison command Cmp_2. The comparison commands Cmp_1 and Cmp_2 allow an operation for reading data from memory cell arrays of channels having received commands and comparing the data with each other to be performed.

According to embodiments, the comparison commands Cmp_1 and Cmp_2 may be provided to two or more channels, wherein data is read from the first channel 110a and the third channel 130a, to which the comparison commands Cmp_1 and Cmp_2 have been provided. Further, the first comparison unit 410 compares the data read from each channel with each other and outputs a comparison result to an exterior source or device. The comparison commands Cmp_1 and Cmp_2 may include information for designating a channel which performs an operation for comparing read data with each other.

For example, the comparison commands Cmp_1 and Cmp_2 may be utilized in order to confirm whether the same data is written in a plurality of channels and then the data has been normally written, similarly to the operation method described with reference to FIG. 2. When the data has not been normally written, error correction may also be additionally performed.

In the invention, the operation, in which a channel having received the first comparison command Cmp_1 performs a comparison operation and outputs a comparison result has been exemplified.

For example, the first comparison unit 410 performs an XOR logical operation and compares data received from the first memory cell array 111 and the third memory cell array 131 with each other. The first comparison unit 410 may output different types of information when data written in channels is equal to each other and is different from each other.

For example, when data of '1010' has been read from the first memory cell array 111 and data of '1111' has been read from the third memory cell array 131, the first comparison unit 410 may compare the data from the two channels 110a and 130a with each other and output a value of '0101'.

On the basis of the value of '0101', the '0' bit may represent that the data of the two channels 110a and 130a is equal to each other, and the '1' bit may represent that the data of the two channels 110a and 130a is not equal to each other. Accordingly, data may be received from the first comparison unit 410 and error correction may be performed for the second bit and the fourth bit.

Differently from the memory device 10 described with reference to FIG. 1 to FIG. 3, the memory device 10a illustrated in FIG. 4 may further include the comparison units 410, 420, 430, and 440. However, through the configuration of the memory device 10a illustrated in FIG. 4, the comparison units 410, 420, 430, and 440 may be deactivated and operations equal to that described with reference to FIG. 1 to FIG. 3 may be performed.

Figure 5:
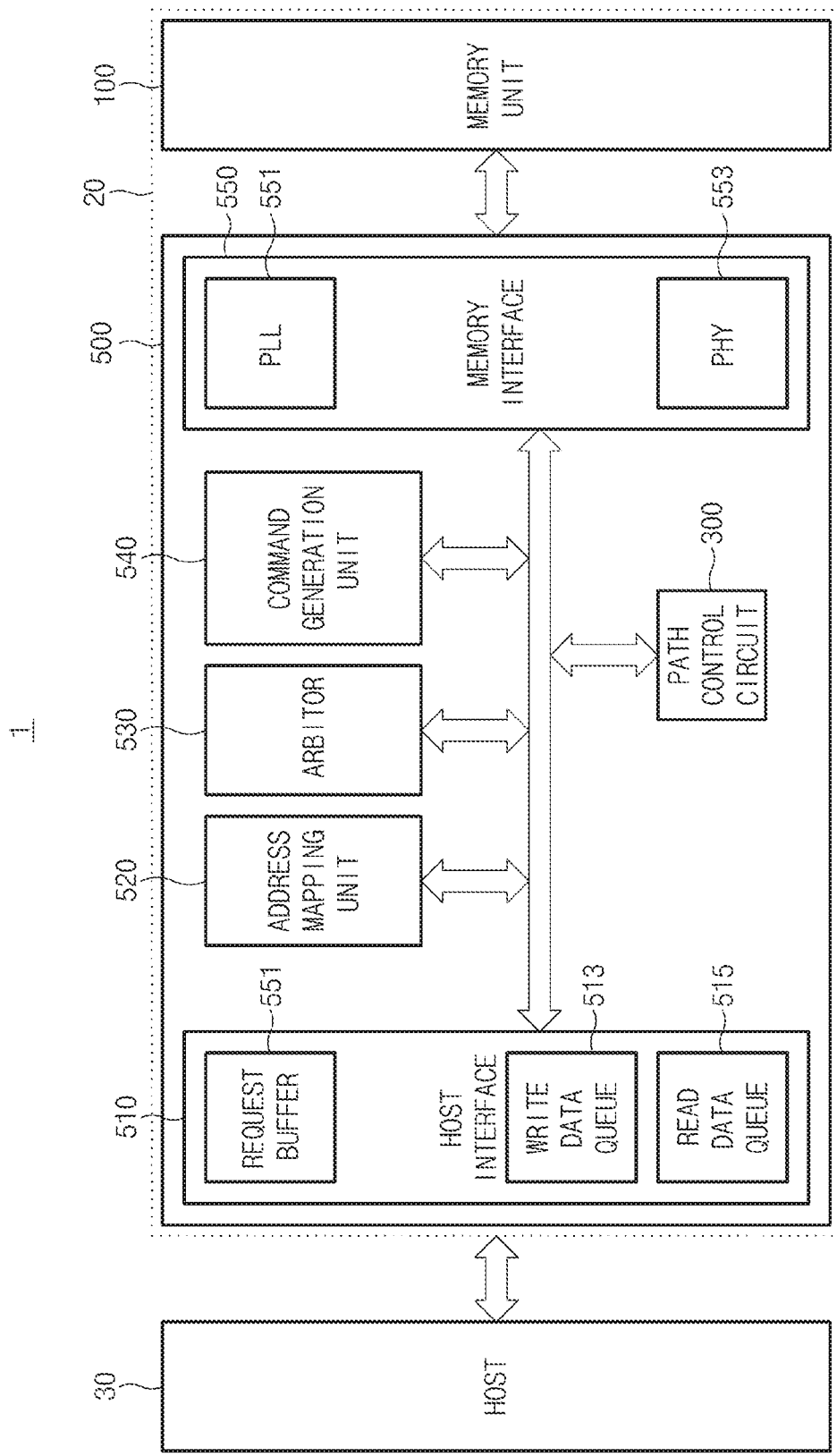
FIG. 5 is a block diagram illustrating an electronic apparatus including a memory device according to an embodiment of the invention.

Referring to FIG. 5, a block diagram illustrating an electronic apparatus including the memory device according to an embodiment of the invention is described.

In FIG. 5, an electronic apparatus 1 may include a host 30 and a memory 20, and the memory 20 may include a memory controller 500 and a memory unit 100.

The host 30 may transmit a request (or a command signal) and data to the memory controller 500 in order to access the memory unit 100. To store data in the memory unit 100, the host 30 may transmit the data to the memory controller 500. Furthermore, the host 30 may receive data, which has been outputted from the memory unit 100, through the memory controller 500. The memory controller 500 may provide the memory unit 100 with data information, address information, memory setup information, a write request, a read request and the like in response to a request; and control the memory unit 100 such that a write or read operation is performed. The memory controller 500 may relay communication between the host 30 and the memory unit 100. The memory controller 500 may receive a request and data from the host 30, and generate data DQ, a data strobe DQS, a command CMD, a memory address signal ADD, a clock signal and the like and provide them to the memory unit 100 in order to control the operation of the memory unit 100. Furthermore, the memory controller 500 may provide the host with the data DQ and the data strobe DQS outputted from the memory unit 100.

In FIG. 5, the memory controller 500 may include a host interface 510, an address mapping unit 520, an arbitor 530, a command generation unit 540, a memory interface 550, and a path control circuit 300.

The host interface 510 may include a request buffer 551, a write data queue 513, and a read data queue 515. The memory interface 550 may be provided as an interface between the memory controller 500 and the memory unit 100. The memory interface 550 may include a phase locked loop (PLL) and a physical layer PHY. FIG. 5 illustrates elements constituting the memory controller 500; however, the invention is not limited thereto, and other elements may be added according to the functions of the memory controller 500.

The request buffer 551 may receive a request inputted from the host 30. The write data queue 513 may receive data inputted from the host 30 and the read data queue 515 may receive data outputted from the memory unit 100.

The address mapping unit 520 may generate a memory address signal from a physical address signal of the request received through the request buffer 551. The arbitor 530 may provide the memory interface 550 with the memory address signal and data received through the write data queue, and provide the read data queue 515 with the data outputted from the memory unit 100.

The arbitor 530 may efficiently control the write data queue 513 and the read data queue 515 on the basis of data traffic. Furthermore, the arbitor 530 may re-align the order of a plurality of requests received from the host 30 in consideration of the operation efficiency of the memory unit 100.

The command generation unit 540 may generate a command from a write request and a read request received in the request buffer 551 and provide the memory unit 100 with the command such that the memory unit 100 may perform a plurality of operations including write, read and refresh. In an embodiment of the invention, the command generation unit 540 may generate two or more commands associated with one another and provide the commands to the plurality of channels 110, 120, 130, 140, 110a, 120a, 130a, and 140a included in the memory unit 100, in addition to the write, read and refresh operations.

For example, as described with reference to FIG. 2, data is provided while providing the external writing command Ext_W to one channel and the data provided to the corresponding channel is provided to other channels through the shared global input/output lines SGIO0 to SGIO3 so that the internal command Int_W can be provided to the other channels.

Furthermore, as described with reference to FIG. 3, the command generation unit 540 may provide one channel with the internal read command Int_R to read data, internally transfer the read data, and write the data in other channels in response to the internal command Int_W.

As described with reference to FIG. 4, the comparison commands Cmp_1 and Cmp_2 may be provided to two or more channels, data may be simultaneously read, and then a comparison result may be outputted.

Although FIG. 5 illustrates the configuration in which the host 30 and the memory controller 500 are physically separated from each other. However, the memory controller 500 may be included (embedded) in a processor such as a central processing unit (CPU), an application processor (AP), or a graphic processing unit (GPU) of the host 30, or may be realized as one chip together with these processors in the form of SoC (System On Chip).

A physical layer 553 may electrically couple the memory controller 500 and the memory unit 100 to each other. A PLL circuit 551 may generate a system clock signal to be used in the memory controller 500. The memory controller 500 may transmit a signal for controlling the operation of the memory unit 100 to the memory unit 100 in synchronization with the system clock signal. The physical layer 553 may convert a signal generated in the memory controller 500 into a signal suitable to be used in the memory unit 100 in synchronization with the system clock signal, or convert a signal outputted from the memory unit 100 into a signal suitable to be used in the memory controller 500. Furthermore, the physical layer 553 may generate a clock signal CLK from the system clock signal and transmit the clock signal CLK to the memory unit 100.

The memory unit 100 according to an embodiment of the invention may include a plurality of channels, wherein each channel may operate in synchronization with clock signals with different frequencies and operate through different interfaces. Accordingly, the memory interface 550 may perform an interfacing operation according to the characteristics of each channel of the memory unit 100.

In an embodiment, the physical layer 553 may include an error correction logic. The error correction logic may add an error correction code to data and write the data in the memory cell arrays 111, 121, 131, and 141 of the channels 110, 120, 130, 140, 110a, 120a, 130a, and 140a included in the memory unit 100, or read the data and the error correction code from the channels 110, 120, 130, 140, 110a, 120a, 130a, and 140a, thereby correcting an error.

Furthermore, the physical layer 553 included in the electronic apparatus 1 according to an embodiment of the invention may also provide the comparison commands Cmp_1 and Cmp_2 to the plurality of channels 110, 120, 130, 140, 110a, 120a, 130a, and 140a included in the memory unit 100, and then correct an error when data among the channels is different from each other.

The memory unit 100 may also receive the memory setup information, the memory address signal ADD, the data DQ, the data strobe DQS, the clock signal CLK and the like from the memory controller 500 through the memory interface 550, and perform a data reception operation on the basis of the signals. On the basis of the memory address signal ADD, the memory unit 100 may store the data DQ in a specific area of a memory cell belonging to a channel of the memory unit 100. Furthermore, on the basis of the command CMD, the memory address signal ADD, the data strobe DQS and the like, which have been received from the memory controller, the memory unit 100 may perform a data transmission operation.

On the basis of the memory address signal ADD, the data DQ, and the data strobe DQS, the memory unit 100 may transmit the data stored in the specific area of the channel of the memory unit 100 to the memory controller 500.

As described above, the memory devices 10 and 10a and the electronic apparatus 1 according to the embodiments of the invention may control path connections of the shared global input/output lines SGIO0 to SGIO3 in response to an internal command capable of transferring data among a plurality of channels. Accordingly, data is transferred among the plurality of channels, so that it is possible to overcome a limitation of an operation time and improve signal integrity.

While various embodiments have been described above, it will be understood to those skilled in the art that the embodiments described are by way of example only. Accordingly, the memory device and the electronic apparatus including the same described herein should not be limited based on the described embodiments.

What is claimed is:

1. A memory device comprising:
a plurality of channels that include memory cell arrays and local input/output lines electrically coupled to the memory cell arrays and are independently operable;
shared global input/output lines electrically coupled to the local input/output lines included in the plurality of channels;
one or more path switch circuits that are arranged among the plurality of channels and control a connection relation of the shared global input/output lines according to a path control signal; and
a path control circuit that generates the path control signal,
wherein, in response to an internal operation command for instructing data transfer from one of the plurality of channels to another of the plurality of channels, the path control circuit generates the path control signal for electrically coupling the shared global input/output lines between the one of the plurality of channels and another of the plurality of channels.

2. The memory device of claim 1, wherein the path switch circuits include bidirectional switches that are respectively electrically coupled to the shared global input/output lines and operates in response to the path control signal.

3. The memory device of claim 1, wherein the internal operation command includes a command for writing write data provided to the one channel to another channel through the shared global input/output lines, and
the path control circuit generates the path control signal such that the shared global input/output lines are electrically coupled between the one channel and the another channel.

4. The memory device of claim 1, wherein the internal operation command includes a command for writing data read from the one channel to another channel through the shared global input/output lines, and the path control circuit generates the path control signal such that the shared global input/output lines are electrically coupled between the one channel and the another channel.

5. The memory device of claim 1, wherein each of the plurality of channels further includes a comparison circuit on the shared global input/output lines.

6. The memory device of claim 1, wherein the internal operation command includes a command for comparing data read from the one channel with data read from another channel and outputting a comparison result, and
the path control circuit generates the path control signal such that the shared global input/output lines are electrically coupled between the one channel and another channel.

7. An electronic apparatus comprising:
a command generator that generates an internal operation command for internally transferring data from one of a plurality of channels to another of the plurality of channels in response to a request from a host;
a path control circuit that generates a path control signal for controlling paths among the plurality of channels according to the internal operation command; and
a memory device that includes a plurality of channels which are independently operable, and internally transfer data from the one channel to another channel through shared global input/output lines electrically coupled to one another according to the path control signal.

8. The electronic apparatus of claim 7, wherein the memory unit comprises:
the plurality of channels that respectively include memory cell arrays and local input/output lines electrically coupled to the memory cell arrays;
the shared global input/output lines electrically coupled to the local input/output lines included in the plurality of channels; and
one or more path switch circuits that are arranged among the plurality of channels and control a connection relation of the shared global input/output lines according to the path control signal.

9. The electronic apparatus of claim 8, wherein the path switch circuits include bidirectional switches that are respectively electrically coupled to the shared global input/output lines and operate in response to the path control signal.

10. The electronic apparatus of claim 7, wherein the command generator generates the internal command for writing write data provided to the one channel in another channel through the shared global input/output lines, and
the path control circuit generates the path control signal for electrically coupling the shared global input/output lines to each other between the one channel and another channel in response to the internal command.

11. The electronic apparatus of claim 7, wherein the command generator generates the internal command for writing data read from the one channel in another channel through the shared global input/output lines, and
the path control circuit generates the path control signal for electrically coupling the shared global input/output lines to each other between the one channel and another channel in response to the internal command.

12. The electronic apparatus of claim 8, wherein each of the plurality of channels further includes a comparison circuit on the shared global input/output lines.

13. The electronic apparatus of claim 12, wherein the command generator generates the internal command for comparing data read from the one channel with data read from another channel and outputting a comparison result, and
the path control circuit generates the path control signal for electrically coupling the shared global input/output lines between the one channel and the another channel according to the internal command.

14. A memory device comprising:
a plurality of channels that are independently operable and that include local input/output lines that are electrically coupled to memory cell arrays;
shared global input/output lines electrically coupled to each other among the plurality of channels while interposing path switch circuits; and
a path control circuit configured to provide path control signals to the path switch circuits electrically coupled to the shared global input/output lines,
wherein, in response to an internal operation command for instructing data transfer from one of the plurality of channels to another of the plurality of channels, the path control circuit generates the path control signals for electrically coupling the shared global input/output lines between the one of the plurality of channels and another of the plurality of channels.

15. The memory device of claim 14, wherein the plurality of channels are divided into a plurality of core areas to independently control operations of the plurality of channels, and configured to perform different operations from one another at a same time.

16. The memory device of claim 15, wherein the path control circuit is configured to generate the path control signals so that the path switch circuits are turned off.

17. The memory device of claim 14, wherein connection states of the plurality of channels are controlled by the path control signals,
wherein the one of the plurality of channels can exchange data with another of the plurality of channels.

18. The memory device of claim 14, wherein the internal operation command includes information that data written in the one of the plurality of channels is also written in another of the plurality of channels,
wherein an external writing command includes information that data provided to the one of the plurality of channels is also written into another of the plurality of channels.

19. The memory device of claim 18, wherein the path control circuit generates one of the path control signals and turns on one of the path switch circuits.

20. The memory device of claim 14, wherein when data is simultaneously written in two or more of the plurality of channels, a writing operation can be performed without being limited by row cycle time.

21. The memory device of claim 14, wherein the path control circuit is configured to control one of the path switch circuits to be in a connected state while an external writing operation is performed for one of the plurality of channels.

22. The memory device of claim 14 wherein one of the plurality of channels is configured to not share the shared global input/output lines with another of the plurality channels.

23. The memory device of claim 14, further comprising:
a plurality of comparison units configured to compare data read through the plurality of channels and correct an error.

24. The memory device of claim 23, wherein a plurality of comparison commands allow an operation for reading the data from the memory cell arrays and comparing the data.

* * * * *